United States Patent
Li (10) Patent No.: US 10,181,579 B2
(45) Date of Patent: Jan. 15, 2019

(54) ORGANIC LIGHT-EMITTING DIODE (OLED) ENCAPSULATION METHODS AND OLED ENCAPSULATION STRUCTURE

(71) Applicant: Shenzhen China Star Optoelectronics Technology Co., Ltd., Shenzhen (CN)

(72) Inventor: Wenjie Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 80 days.

(21) Appl. No.: 15/509,196

(22) PCT Filed: Feb. 16, 2017

(86) PCT No.: PCT/CN2017/073728
§ 371 (c)(1),
(2) Date: Mar. 7, 2017

(87) PCT Pub. No.: WO2018/133147
PCT Pub. Date: Jul. 26, 2018

(65) Prior Publication Data
US 2018/0233700 A1    Aug. 16, 2018

(30) Foreign Application Priority Data
Jan. 18, 2017   (CN) .......................... 2017 1 0036058

(51) Int. Cl.
*H01L 51/52*        (2006.01)
*H01L 51/56*        (2006.01)

(52) U.S. Cl.
CPC ...... *H01L 51/5256* (2013.01); *H01L 51/5246* (2013.01); *H01L 51/56* (2013.01)

(58) Field of Classification Search
CPC .. H01L 51/5256; H01L 51/5246; H01L 51/56
See application file for complete search history.

(56) References Cited

U.S. PATENT DOCUMENTS

| | | |
|---|---|---|
| 2007/0164666 A1 | 7/2007 | Oosono et al. |
| 2012/0146492 A1 | 6/2012 | Ryu |

(Continued)

*Primary Examiner* — Christine Enad
(74) *Attorney, Agent, or Firm* — Leong C. Lei (57) ABSTRACT

The present disclosure relates to an OLED encapsulation method and an OLED encapsulation structure. The OLED encapsulation method combines the frame glue encapsulation technology and the thin film encapsulation technology. By adopting the frame glue to block the organic layer and to limit the dimension of the organic layer, each of the organic layers can be completely covered by the inorganic layer arranged thereon. At the same time, the inorganic layers may be manufactured by the same mask, which reduces the number of the mask so as to reduce the cost. The OLED encapsulation structure combines the frame glue encapsulation technology and the thin film encapsulation technology. By adopting the frame glue to block the organic layer and to limit the dimension of the organic layer, each of the organic layers can be completely covered by the inorganic layer arranged thereon. At the same time, the inorganic layers may be manufactured by the same mask, which reduces the number of the mask so as to reduce the cost.

10 Claims, 5 Drawing Sheets

(56) References Cited

U.S. PATENT DOCUMENTS

| | | | | |
|---|---|---|---|---|
| 2014/0339516 A1* | 11/2014 | Hu | ........................ | H01L 51/448 |
| | | | | 257/40 |
| 2016/0172621 A1* | 6/2016 | Jiao | ........................ | H01L 51/56 |
| | | | | 257/40 |
| 2016/0322604 A1* | 11/2016 | Ho | ...................... | H01L 27/3244 |

* cited by examiner

ORGANIC LIGHT-EMITTING DIODE (OLED) ENCAPSULATION METHODS AND OLED ENCAPSULATION STRUCTURE

BACKGROUND OF THE INVENTION

1. Field of the Invention

The present disclosure relates to display technology, and more particularly to an OLED encapsulation method and an OLED encapsulation structure.

2. Discussion of the Related Art

Organic light Emitting Diode (OLED) is characterized by self-luminous, low driving voltage, high luminous efficiency, short response time, high definition and contrast, the viewing angle is about 180 degrees, a wide using temperature range, and may be adopted to implement flexible displays and large-scale full color display, and thus has been recognized as the most potential display devices.

OLED may include passive matrix OLED (PMOLED) and active matrix OLED (AMOLED), that is, a direct address-finding and a thin film transistor (TFT) address-finding, wherein the AMOLED includes pixels arranged in a matrix, and is directed to the active display device having a high lighting efficiency. The AMOLED is usually adopted by high-scale display device having high resolution.

OLED component usually includes a substrate, an anode on the substrate, a through hole injection layer on the anode, a through hole transmission layer on the through hole injection layer, a light emitting layer on the through hole transmission layer, an electronic transmission layer on the light emitting layer, an electronic injection layer on the electronic transmission layer, and a cathode on the electronic injection layer. The semiconductor material and the organic light emitting material are driven by an electronic field to cooperate with the injected carrier to emit lights. Specifically, the OLED component usually adopts an ITO electrode and a metallic electrode respectively to be the anode and the cathode of the component. When being driven by a certain voltage, the electron and the through hole are respectively injected to the electronic transmission layer and the through hole transmission layer via the cathode and the anode. The electron and the through hole respectively transit to the light emitting layer via the electronic transmission layer and the through hole transmission layer, and contact with each other in the light emitting layer to form the excitons and the luminescent molecules are excited, which emit visible lights by radiation relaxation.

Flexible OLED is a key research issue. Usually, the light emitting material of the OLED component is the polymer or small organic molecules. The cathode usually made by active metals having a low active function, such as magnesium aluminum.

These luminescent materials and cathode materials are very sensitive to water vapor and oxygen. Water/oxygen penetration will greatly reduce the life of OLED devices. In order to achieve commercialization of OLED devices, especially the life cycle and stability requirements, the packaging requirements for the OLED devices are very high. Usually, at with respect to the life cycle, at least $10^4$ hours or more is the minimum requirement. Water vapor transmission rate has to be less than $10^{-6}$ g/m$^2$/day, and oxygen permeability has to be less than $10^{-6}$ cc/m$^2$/day (1 atm), and thus encapsulation is a very important issue, that is, the encapsulation is one of the key factors affecting the yield rate.

The traditional encapsulation technology includes: (1) cover packaging technology: coating frame glue or Dam & Fill, which is curable by ultraviolet (UV) rays, on the encapsulation glass/metal. After being cured, a relative closed environment is provided for the light emitting component, wherein the water vapor is avoided; (2) laser packaging technology: coating glass glue on the encapsulation glass. The volatile solvent becomes glass powder. After the vapored substrate and the encapsulation cover are assembled, the laser melting glass powder is adopted to bond the substrate with the encapsulation cover. The above encapsulation solutions may effectively block the water/oxygen, but the thickness and the weight of the devices may be increased, which is not appropriate for the flexible OLED.

Recently, the thin film encapsulation (TFE) solution can solve the disadvantages of the conventional encapsulation technology. With respect to the TFE, the encapsulation cover and the frame glue are not needed, and the TFE replaces the traditional glass encapsulation. As such, the encapsulation for large-scale device may be completed, and the device may be thin and light. Regarding the TFE, an inorganic-organic alternating layer is formed on the surface of the OLED area on the substrate, and a thin film is deposited to block the water and oxygen. The inorganic layer is mainly made by silicon nitride, silicon oxide or aluminum oxide, and may effectively block the water and oxygen. However, during the manufacturing process, some pinholes or particles are produced. The organic layer is mainly made by polymer, organic silicon, resin, etc., and is for covering the defects caused by the inorganic layer. The organic layer also can release the stress between the inorganic layer, which contributes to flattening.

Figure 1:
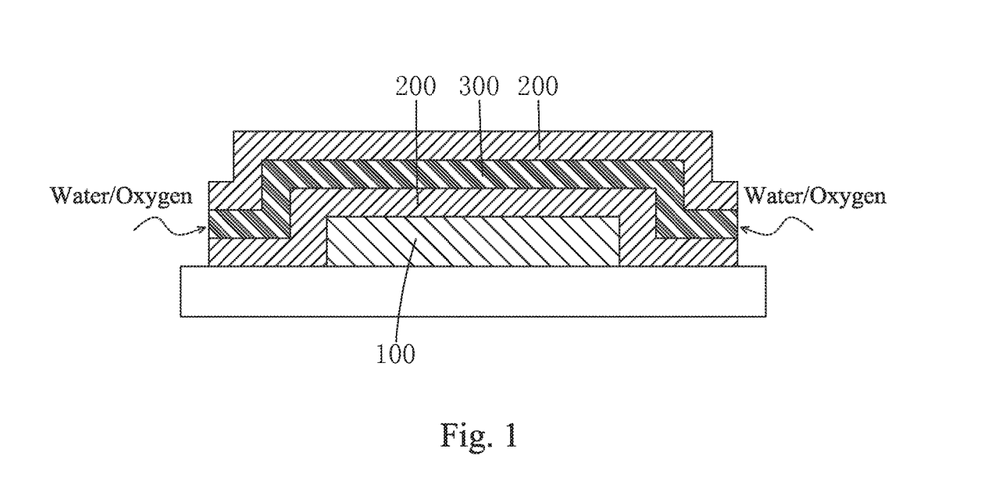
FIG. 1 is a cross section view of one conventional thin film encapsulation structure.
Figure 2:
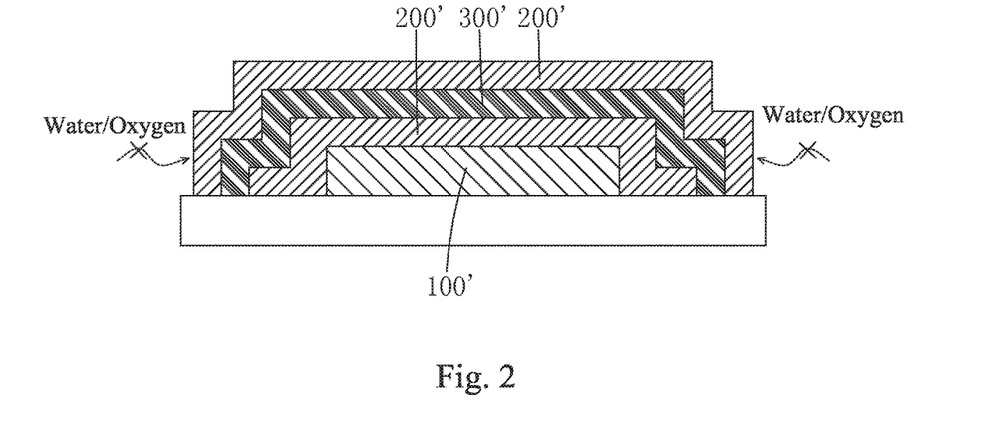
FIG. 2 is a cross section view of another conventional thin film encapsulation structure.

As shown in FIG. 1, the OLED component 100 includes alternating inorganic layers 200 and organic layers 300. The dimension of the inorganic layers 200 is the same with the dimension of the organic layers 300. The manufacturing process of the TFE is simple, wherein only one set of Mask is needed to deposit the inorganic layers 200. However, the deposited inorganic layers 200 have not completed covered the organic layers 300, and ends of the organic layers 300 may contact with air, which is a channel for the water vapor and may damage the encapsulation effect. Thus, another thin film encapsulation structure, as shown in FIG. 2, is developed. The OLED component 100' includes alternating inorganic layers 200' and organic layers 300'. The dimension of the inorganic layers 200' is greater than the dimension of the organic layers 300' covering on the inorganic layers 200' such that each of the organic layers 300' is covered by the inorganic layers 200.' This configuration can prevent the water vapor from entering the internal of the OLED device from the organic layers 300'. However, as the dimensions of the inorganic layers 200' of the OLED component 100' are configured to be increased along an upward direction, and thus a plurality of masks have to be adopted to deposit the inorganic layers 200'. Also, during the manufacturing process, it is needed to change the mask time to time, which makes the manufacturing process very complicated, and may introduce uncontrollable factors.

SUMMARY

The present disclosure relates to an OLED encapsulation method to enhance the encapsulation effect and to save the cost at the same time.

In one aspect, an organic light-emitting diode (OLED) encapsulation method includes: step 1: providing a base substrate, and forming an OLED component on the base substrate; step 2: forming first frame glue on the base substrate, the first frame glue is configured to be in a rim of the OLED component, and curing the first frame glue, a height of the first frame glue is greater than the height of the OLED component; forming a first inorganic layer on the OLED component, the first frame glue, and the base substrate, the first inorganic layer covers the OLED component and the first frame glue, and a dimension of the first inorganic layer is greater than the dimension surrounded by the first frame glue along a horizontal direction; step 4: forming a first organic layer within the first inorganic layer on the first inorganic layer, and curing the first organic layer; step 5: forming a second inorganic layer on the first organic layer and the first inorganic layer, and the second inorganic layer covers the first organic layer, and the dimension of the second inorganic layer is greater than the dimension of the first organic layer.

Wherein a height of the first frame glue is in a range from 3 μm to 20 μm, and a width of the first frame glue is in a range from 0.1 mm to 5 mm; a distance between an internal edge of the second frame glue and an edge of the OLED component is in a range from 1 mm to 10 mm; the first frame glue is made by at least one of silicone resin and polymethylmethacrylate.

Wherein a distance between the edge of the first inorganic layer and the second inorganic layer and an external edge of the first frame glue is in a range from 50 μm to 2000 μm; a thickness of the first inorganic layer and the second inorganic layer is in a range from 100 nm to 1 μm; the first inorganic layer and the second inorganic layer are made by at least one of silicon oxide, silicon nitride, and aluminum oxide; the first inorganic layer and the second inorganic layer are made by at least one of Plasma Enhanced Chemical Vapor Deposition (PECVD), Atomic Layer Deposition (ALD) and Sputtering.

Wherein the thickness of the first organic layer is in a range from 500 nm to 5 μm; the first organic layer is made by at least one of silicone resin and polymethylmethacrylate; the first organic layer is manufactured by at least one of screen printing, spin coating, ink jet printing, and cast film formation Wherein the method further includes: step 6: forming at least one encapsulation unit on the second inorganic layer, the encapsulation unit includes second frame glue, a second organic layer arranged within the second frame glue, and a third inorganic layer covers the second organic layer and the second frame glue.

In another aspect, an OLED encapsulation structure includes: a base substrate, an OLED component arranged on the base substrate, first frame glue arranged on the base substrate and the first frame glue is in a rim of the OLED component, and a first inorganic layer arranged on the OLED component, the first frame glue, and the base substrate, a first organic layer arranged on the first inorganic layer and the first organic layer is surrounded by the first frame glue, and a second inorganic layer on the first organic layer and the first inorganic layer; a height of the first frame glue is greater than the height of the OLED component, the first inorganic layer covers the OLED component and the first inorganic layer, and the dimension of the first inorganic layer is greater than the dimension surrounded by the first frame glue along a horizontal direction; the second inorganic layer covers the first organic layer, and the dimension of the second inorganic layer is greater than the dimension of the first organic layer.

Wherein a height of the first frame glue is in a range from 3 μm to 20 μm, and a width of the first frame glue is in a range from 0.1 mm to 5 mm; a distance between an internal edge of the second frame glue and an edge of the OLED component is in a range from 1 mm to 10 mm; the first frame glue is made by at least one of silicone resin and polymethylmethacrylate.

Wherein a distance between the edge of the first inorganic layer and the second inorganic layer and an external edge of the first frame glue is in a range from 50 μm to 2000 μm; a thickness of the first inorganic layer and the second inorganic layer is in a range from 100 nm to 1 μm; the first inorganic layer and the second inorganic layer are made by at least one of silicon oxide, silicon nitride, and aluminum oxide.

Wherein the thickness of the first organic layer is in a range from 500 nm to 5 μm; the first organic layer is made by at least one of silicone resin and polymethylmethacrylate.

Wherein the encapsulation structure further includes at least one encapsulation unit on the second inorganic layer, the encapsulation unit includes second frame glue, a second organic layer arranged within the second frame glue, and a third inorganic layer covers the second organic layer and the second frame glue.

In another aspect, an OLED encapsulation structure includes: a base substrate, an OLED component arranged on the base substrate, first frame glue arranged on the base substrate and the first frame glue is in a rim of the OLED component, and a first inorganic layer arranged on the OLED component, the first frame glue, and the base substrate, a first organic layer arranged on the first inorganic layer and the first organic layer is surrounded by the first frame glue, and a second inorganic layer on the first organic layer and the first inorganic layer; a height of the first frame glue is greater than the height of the OLED component, the first inorganic layer covers the OLED component and the first inorganic layer, and the dimension of the first inorganic layer is greater than the dimension surrounded by the first frame glue along a horizontal direction; the second inorganic layer covers the first organic layer, and the dimension of the second inorganic layer is greater than the dimension of the first organic layer; wherein a height of the first frame glue is in a range from 3 μm to 20 μm, and a width of the first frame glue is in a range from 0.1 mm to 5 mm; a distance between an internal edge of the second frame glue and an edge of the OLED component is in a range from 1 mm to 10 mm; the first frame glue is made by at least one of silicone resin and polymethylmethacrylate; wherein a distance between the edge of the first inorganic layer and the second inorganic layer and an external edge of the first frame glue is in a range from 50 μm to 2000 μm; a thickness of the first inorganic layer and the second inorganic layer is in a range from 100 nm to 1 μm; the first inorganic layer and the second inorganic layer are made by at least one of silicon oxide, silicon nitride, and aluminum oxide.

Wherein the thickness of the first organic layer is in a range from 500 nm to 5 μm; the first organic layer is made by at least one of silicone resin and polymethylmethacrylate.

Wherein the encapsulation structure further includes at least one encapsulation unit on the second inorganic layer, the encapsulation unit includes second frame glue, a second organic layer arranged within the second frame glue, and a third inorganic layer covers the second organic layer and the second frame glue.

The OLED encapsulation method combines the frame glue encapsulation technology and the thin film encapsulation technology. By adopting the frame glue to block the organic layer and to limit the dimension of the organic layer, each of the organic layers can be completely covered by the inorganic layer arranged thereon. At the same time, the inorganic layers may be manufactured by the same mask, which reduces the number of the mask so as to reduce the cost. The OLED encapsulation structure combines the frame glue encapsulation technology and the thin film encapsulation technology. By adopting the frame glue to block the organic layer and to limit the dimension of the organic layer, each of the organic layers can be completely covered by the inorganic layer arranged thereon. At the same time, the inorganic layers may be manufactured by the same mask, which reduces the number of the mask so as to reduce the cost.

BRIEF DESCRIPTION OF THE DRAWINGS

Embodiments of the invention will now be described more fully hereinafter with reference to the accompanying drawings, in which the technical advantages of the embodiments of the invention are shown.

DETAILED DESCRIPTION OF THE EMBODIMENTS

Embodiments of the invention will now be described more fully hereinafter with reference to the accompanying drawings, in which embodiments of the invention are shown.

Figure 3:
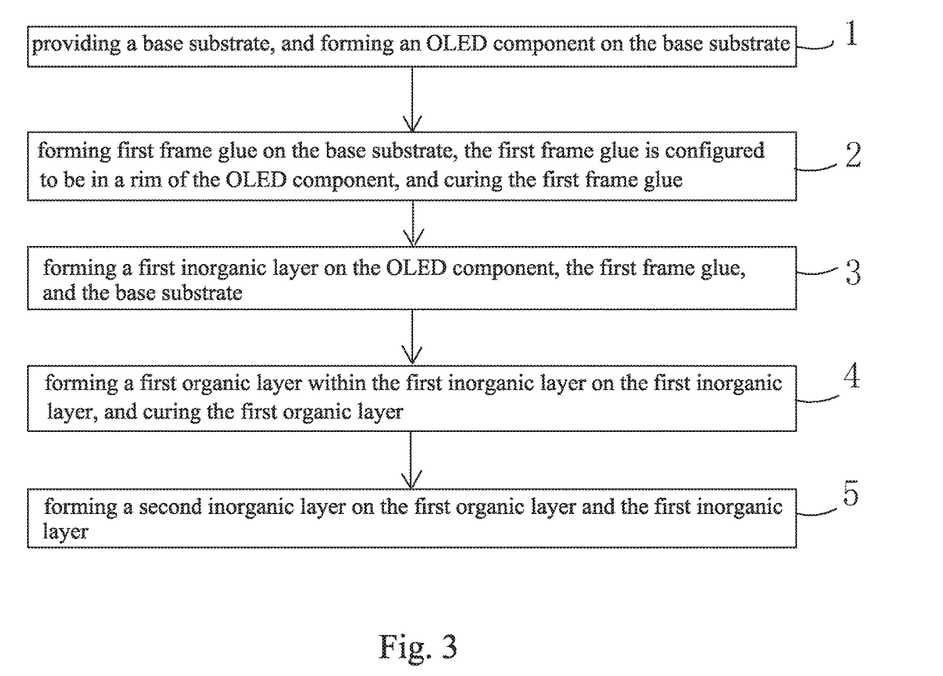
FIG. 3 is a flowchart illustrating the OLED encapsulation method in accordance with one embodiment.
Figure 4:
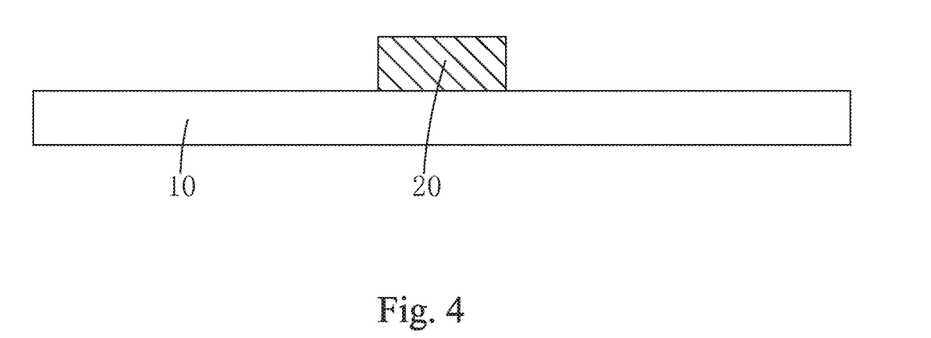
FIG. 4 is a schematic view showing step 1 of the OLED encapsulation method in accordance with one embodiment.

FIG. 3 is a flowchart illustrating the OLED encapsulation method in accordance with one embodiment. The method includes the following steps:

In step 1, as shown in FIG. 4, providing a base substrate 10, and forming an organic light emitting diode (OLED) component 20 on the base substrate 10.

Specifically, the base substrate 10 is a TFT substrate.

Figure 5:
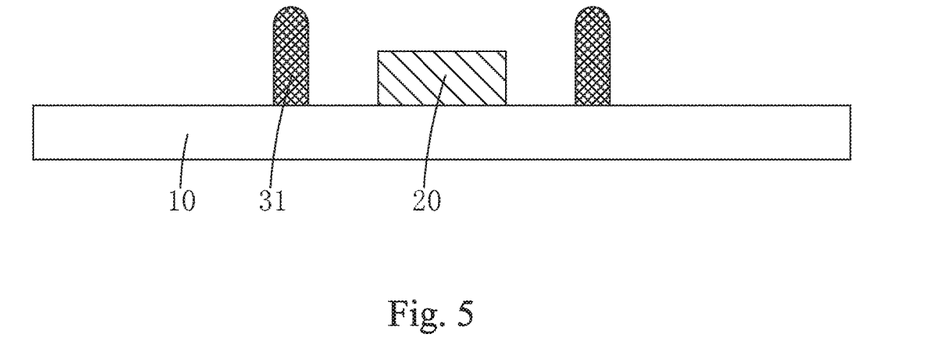
FIG. 5 is a schematic view showing step 2 of the OLED encapsulation method in accordance with one embodiment.

In step 2, as shown in FIG. 5, forming first frame glue 31 on the base substrate 10, the first frame glue 31 is configured to be in a rim of the OLED component 20, and curing the first frame glue 31. A height of the first frame glue 31 is greater than the height of the OLED component 20.

Specifically, the height of the first frame glue 31 is in a range from 3 µm to 20 µm, and a width of the first frame glue 31 is in a range from 0.1 mm to 5 mm.

Specifically, a distance between an internal edge of the first frame glue 31 and an edge of the OLED component 20 is in a range from 1 mm to 10 mm.

Specifically, the first frame glue 31 is made by silicon resin or acrylic resin.

Specifically, the first frame glue 31 may be cured by heat curing or UV curing. Preferably, the first frame glue 31 is cured by the UV curing.

Figure 6:
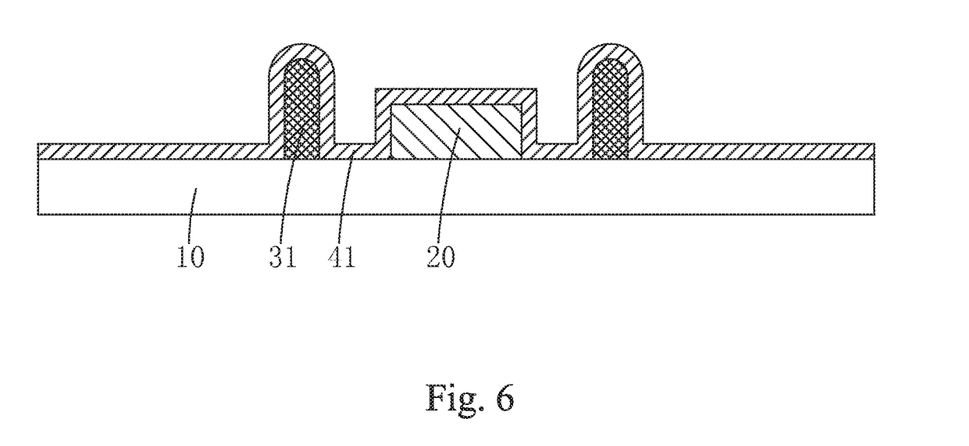
FIG. 6 is a schematic view showing step 3 of the OLED encapsulation method in accordance with one embodiment.

In step 3, as shown in FIG. 6, forming a first inorganic layer 41 on the OLED component 20, the first frame glue 31, and the base substrate 10. The first inorganic layer 41 covers the OLED component 20 and the first frame glue 31, and the dimension of the first inorganic layer 41 is greater than the dimension surrounded by the first frame glue 31 along a horizontal direction.

Specifically, the distance between the edge of the first inorganic layer 41 and an external edge of the first frame glue 31 is in a range from 50 µm to 2000 µm.

Specifically, a thickness of the first inorganic layer 41 is in a range from 100 nm to 1 µm.

Specifically, the manufacturing method of the first inorganic layer 41 may include at least one of Plasma Enhanced Chemical Vapor Deposition (PECVD), Atomic Layer Deposition (ALD) and Sputtering.

Specifically, the first inorganic layer 41 may be made by at least one of silicon oxide, silicon nitride, and aluminum oxide.

Figure 7:
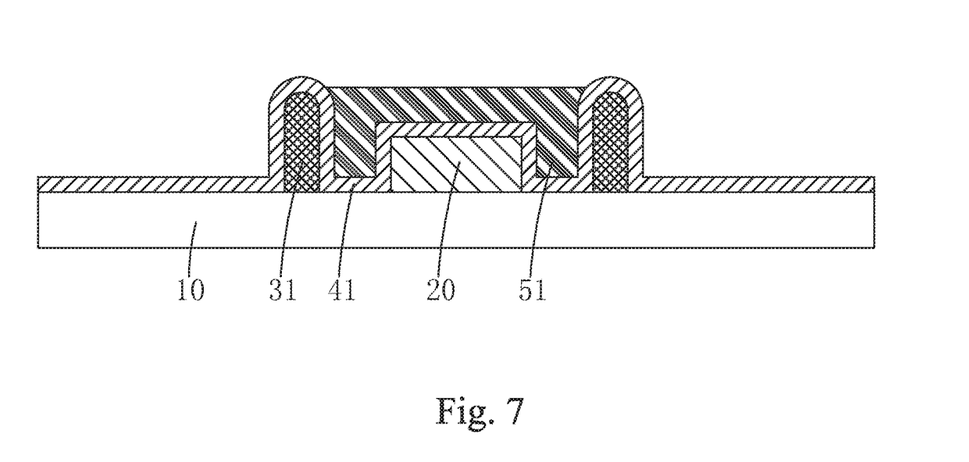
FIG. 7 is a schematic view showing step 4 of the OLED encapsulation method in accordance with one embodiment.

In step 4, as shown in FIG. 7, forming a first organic layer 51 within the first inorganic layer 41 on the first inorganic layer 41, and curing the first organic layer 51.

During the manufacturing process of the first organic layer 51, the first frame glue 31 provides the anti-flow function and the first frame glue 31 limits the dimension of the first organic layer 51, which ensure that a second inorganic layer 42 manufactured afterward may completely covers the first organic layer 51, and thus the encapsulation effect may be enhanced.

Specifically, the thickness of the first organic layer 51 is in a range from 500 nm to 5 µm.

Specifically, the manufacturing method of the first organic layer 51 includes at least one of screen printing, spin coating, ink jet printing, and cast film formation Specifically, the first organic layer 51 is made by organic resin. Preferably, the first organic layer 51 includes at least one of silicone resin and polymethylmethacrylate.

Specifically, the curing method of the first organic layer 51 includes at least one of the heat curing and the UV curing. Preferably, the curing method of the first organic layer 51 is the heat curing.

Figure 8:
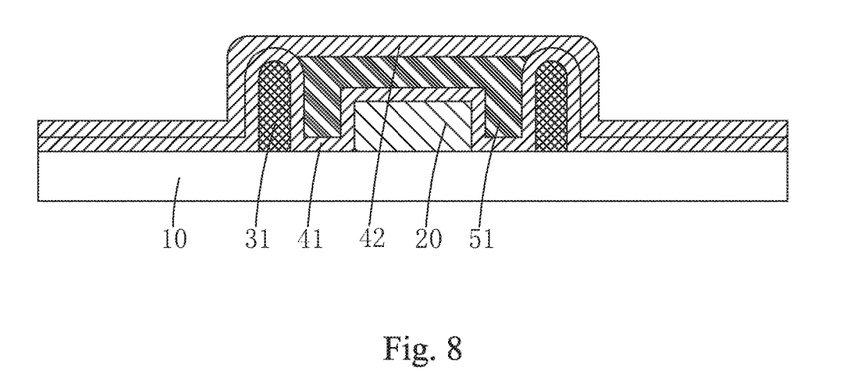
FIG. 8 is a schematic view showing step 5 of the OLED encapsulation method and a cross section view of the OLED encapsulation structure in accordance with a first embodiment.

In step 5, as shown in FIG. 8, forming the second inorganic layer 42 on the first organic layer 51 and the first inorganic layer 41, and the second inorganic layer 42 covers the first organic layer 51. In addition, the dimension of the second inorganic layer 42 is greater than the dimension of the first organic layer 51.

Specifically, the distance between the edge of the second inorganic layer 42 and the external edge of the first inorganic layer 41 along the horizontal direction is in a range from 50 µm to 2000 µm.

Specifically, the thickness of the second inorganic layer 42 is in a range from 100 nm to 1 µm.

Specifically, the manufacturing method of the second inorganic layer 42 includes at least one of PECVD, ALD and sputtering.

Specifically, the second inorganic layer 42 may be made by at least one of silicon oxide, silicon nitride, and aluminum oxide.

Specifically, the second inorganic layer 42 and the first inorganic layer 41 may be manufactured by the same mask, which reduces the number of masks so as to save the cost.

Figure 9:
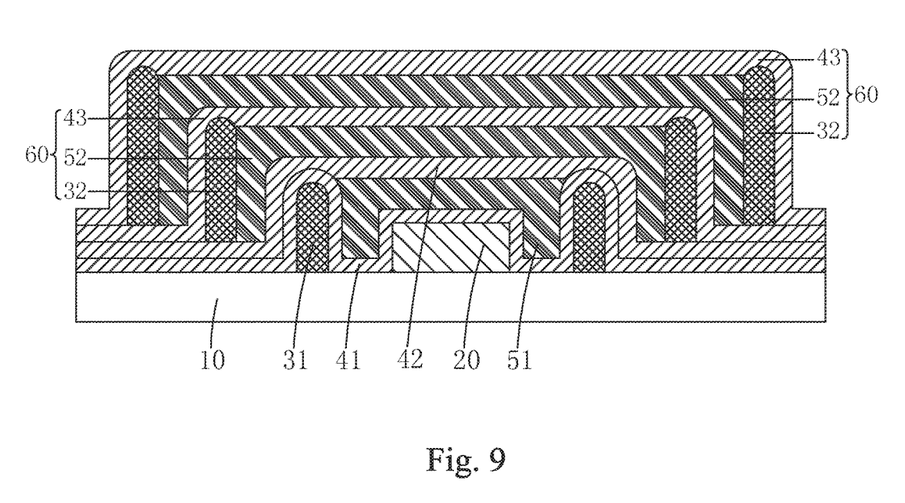
FIG. 9 is a schematic view showing step 6 of the OLED encapsulation method and a cross section view of the OLED encapsulation structure in accordance with a first embodiment.

Preferably, the OLED encapsulation method also includes:

In step 6, as shown in FIG. 9, forming at least one encapsulation unit 60 on the second inorganic layer 42. The encapsulation unit 60 includes second frame glue 32, a second organic layer 52 arranged within the second frame glue 32, a third inorganic layer 43 covering the second organic layer 52 and the second frame glue 32.

Specifically, the dimension of the third inorganic layer 43 is greater than the dimension surrounded by the second frame glue 32 along the horizontal direction.

Preferably, the second frame glue 32 is in a rim of the first frame glue 31 along the horizontal direction.

Preferably, the distance between the internal edge of the second frame glue 32 of the encapsulation unit 60 and the edge of the OLED component 20 is gradually increased along an upward direction from the base substrate 10.

Specifically, a height of the second frame glue 32 is in a range from 3 μm to 20 μm, and the width of the second frame glue 32 is in a range from 0.1 mm to 5 mm.

Specifically, the distance between the internal edge of the second frame glue 32 and the edge of the OLED component 20 is in a range from 1 mm to 10 mm along the horizontal direction.

Preferably, the second frame glue 32 is made by at least one of silicone resin and polymethylmethacrylate.

Specifically, the second frame glue 32 is cured by at least one of the heat curing and the UV curing. Preferably, the second frame glue 32 is cured by the heat curing.

Specifically, the thickness of the third inorganic layer 43 is in a range from 100 nm to 1 μm.

Specifically, the manufacturing method of the third inorganic layer 43 includes at least one of PECVD, ALD and sputtering.

Specifically, the third inorganic layer 43 may be made by at least one of silicon oxide, silicon nitride, and aluminum oxide.

Specifically, the thickness of the second organic layer 52 is in a range from 500 nm to 5 μm.

Specifically, the manufacturing method of the second organic layer 52 includes at least one of screen printing, spin coating, ink jet printing, and cast film formation Specifically, the second organic layer 52 is made by organic resin. Preferably, the second organic layer 52 includes at least one of silicone resin and polymethylmethacrylate.

Specifically, the curing method of the second organic layer 52 includes at least one of the heat curing and the UV curing. Preferably, the curing method of the second organic layer 52 is the heat curing.

Specifically, the third inorganic layer 43 may be manufactured by the same mask manufacturing the first inorganic layer 41 and the second inorganic layer 42, which reduces the number of masks so as to save the cost.

The steps 1 through 5 of the OLED encapsulation method will be described in accordance with two embodiments.

First Embodiment

In step 1, as shown in FIG. 4, providing a base substrate 10, and forming an organic light emitting diode (OLED) component 20.

In step 2, as shown in FIG. 5, forming first frame glue 31 on the base substrate 10, the first frame glue 31 is configured to be in a rim of the OLED component 20, and curing the first frame glue 31. The first frame glue 31 is ring-shaped.

The height of the first frame glue 31 is in a range from 3 μm to 6 μm, and the width of the first frame glue 31 is in a range from 0.1 mm to 3 mm.

The distance between the internal edge of the first frame glue 31 and the edge of the OLED component 20 is in a range from 1.0 mm to 1.5 mm.

The first frame glue 31 is made by acrylic resin.

The first frame glue 31 is cured by the UV curing. During the UV curing process, the intensity of the UV rays is in a range from 3000 mJ/cm$^2$-5000 mJ/cm$^2$, and the UV radiation time period is in a range from 30 s to 100 s.

In step 3, as shown in FIG. 6, forming a first inorganic layer 41 on the base substrate 10 and the OLED component 20. The first inorganic layer 41 covers the OLED component 20 and the first frame glue 31, and the dimension of the first inorganic layer 41 is greater than the dimension surrounded by the first frame glue 31 along a horizontal direction.

The first inorganic layer 41 is mainly made by silicon nitride.

The manufacturing method of the first inorganic layer 41 is PECVD. The parameters of the PECVD are as follows: using monosilane ($SiH_4$) and ammonia ($NH_3$) as the reaction gas, the purity of monosilane and ammonia is more than 99.99%, the auxiliary ionization gas is argon (Ar) having the purity equals to 99.99%, the power of RF power is 10 w~500 w, the pressure of the deposition chamber is 10 Pa~20 Pa, the deposition rate is 3 nm/S~20 nm/s, and the deposition time is 20 min~60 min.

In step 4, as shown in FIG. 7, forming a first organic layer 51 within the first inorganic layer 41 on the first inorganic layer 41, and curing the first organic layer 51.

The manufacturing method of the first organic layer 51 is ink jet printing.

The first organic layer 51 is mainly made by silicon resin. Preferably, the adhesive of the silicon resin is in a range from 10 cps to 20 cps.

The thickness of the first organic layer 51 is in a range from 500 nm to 800 nm.

In step 5, as shown in FIG. 8, forming the second inorganic layer 42 on the first organic layer 51 and the first inorganic layer 41, and the second inorganic layer 42 covers the first organic layer 51. In addition, the dimension of the second inorganic layer 42 is greater than the dimension of the first organic layer 51.

Second Embodiment

In step 1, as shown in FIG. 4, providing a base substrate 10, and forming an organic light emitting diode (OLED) component 20.

In step 2, as shown in FIG. 5, forming first frame glue 31 on the base substrate 10, the first frame glue 31 is configured to be in a rim of the OLED component 20, and curing the first frame glue 31. The first frame glue 31 is ring-shaped.

The height of the first frame glue 31 is in a range from 10 μm to 15 μm, and the width of the first frame glue 31 is in a range from 1 mm to 2 mm.

The distance between the internal edge of the first frame glue 31 and the edge of the OLED component 20 is in a range from 1.5 mm to 2 mm.

The first frame glue 31 is made by acrylic resin.

The first frame glue 31 is cured by the heat curing. During the heat curing process, the heating temperature is in a range from 60 degree (Celsius) to 90 degrees, and the heating time period is in a range from 30 mins to 100 mins.

In step 3, as shown in FIG. 6, forming a first inorganic layer 41 on the base substrate 10 and the OLED component 20. The first inorganic layer 41 covers the OLED component 20 and the first frame glue 31, and the dimension of the first inorganic layer 41 is greater than the dimension surrounded by the first frame glue 31 along a horizontal direction.

The first inorganic layer 41 is mainly made by silicon nitride.

The manufacturing method of the first inorganic layer 41 is PECVD. The parameters of the PECVD are as follows: using monosilane ($SiH_4$) and ammonia ($NH_3$) as the reaction gas, the purity of monosilane and ammonia is more than 99.99%, the auxiliary ionization gas is argon (Ar) having the purity equals to 99.99%, the power of RF power is 10 W~500 W, the pressure of the deposition chamber is 10 Pa~20 Pa, the deposition rate is 3 nm/S~20 nm/s, and the deposition time is 20 min~60 min.

In step 4, as shown in FIG. 7, forming a first organic layer 51 within the first inorganic layer 41 on the first inorganic layer 41, and curing the first organic layer 51.

The manufacturing method of the first organic layer 51 is ink jet printing.

The first organic layer 51 is mainly made by polymethyl methacrylate.

The thickness of the first organic layer 51 is in a range from 1 μm to 2 μm.

The first organic layer 51 is cured by the heat curing. During the heat curing process, the heating temperature is in a range from 60 degree (Celsius) to 90 degrees, and the heating time period is in a range from 30 mins to 100 mins.

In step 5, as shown in FIG. 8, forming the second inorganic layer 42 on the first organic layer 51 and the first inorganic layer 41, and the second inorganic layer 42 covers the first organic layer 51. In addition, the dimension of the second inorganic layer 42 is greater than the dimension of the first organic layer 51.

In view of the above, by adopting the frame glue to block the organic layer and to limit the dimension of the organic layer, each of the organic layers can be completely covered by the inorganic layer arranged thereon. This not only enhances the encapsulation effect, and the inorganic layers can be manufactured by the same mask, which reduces the number of the masks so as to reduce the manufacturing cost.

Referring to FIG. 8, an OLED encapsulation structure includes a base substrate 10, an OLED component 20 arranged on the base substrate 10, first frame glue 31 arranged on the base substrate 10 and the first frame glue 31 is in a rim of the OLED component 20, and a first inorganic layer 41 arranged on the OLED component 20, the first frame glue 31, and the base substrate 10, a first organic layer 51 arranged on the first inorganic layer 41 and the first organic layer 51 is surrounded by the first frame glue 31, and a second inorganic layer 42 on the first organic layer 51 and the first inorganic layer 41.

The height of the first frame glue 31 is greater than the height of the OLED component 20. The first inorganic layer 41 covers the OLED component 20 and the first inorganic layer 41, and the dimension of the first inorganic layer 41 is greater than the dimension surrounded by the first frame glue 31 along the horizontal direction. The second inorganic layer 42 covers the first organic layer 51, and the dimension of the second inorganic layer 42 is greater than the dimension of the first organic layer 51.

Specifically, the base substrate 10 is a TFT substrate.

Specifically, the height of the first inorganic layer 41 is in a range from 3 μm to 20 μm, and the width of the first frame glue 31 is in a range from 0.1 mm to 5 mm.

Specifically, a distance between an internal edge of the first frame glue 31 and an edge of the OLED component 20 is in a range from 1 mm to 10 mm.

Specifically, the first frame glue 31 is made by silicon resin or acrylic resin.

Specifically, the distance between the edge of the first inorganic layer 41 and an external edge of the first frame glue 31 is in a range from 50 μm to 2000 μm.

Specifically, a thickness of the first inorganic layer 41 is in a range from 100 nm to 1 μm.

Specifically, the first inorganic layer 41 may be made by at least one of silicon oxide, silicon nitride, and aluminum oxide.

Preferably, the materials, the dimension, and a projection location of the second inorganic layer 42 on the base substrate 10 are the same of that of the first inorganic layer 41.

Specifically, the thickness of the first organic layer 51 is in a range from 500 nm to 5 μm.

Specifically, the first organic layer 51 is made by organic resin. Preferably, the first organic layer 51 includes at least one of silicone resin and polymethylmethacrylate.

Referring to FIG. 9, the OLED encapsulation structure further includes an encapsulation unit 60 on the second inorganic layer 42. The encapsulation unit 60 includes second frame glue 32, a second organic layer 52 arranged within the second frame glue 32, a third inorganic layer 43 covering the second organic layer 52 and the second frame glue 32.

Specifically, the dimension of the third inorganic layer 43 is greater than the dimension surrounded by the second frame glue 32 along the horizontal direction.

Preferably, the second frame glue 32 is in a rim of the first frame glue 31 along the horizontal direction.

Preferably, the distance between the internal edge of the second frame glue 32 of the encapsulation unit 60 and the edge of the OLED component 20 is gradually increased along an upward direction from the base substrate 10.

Specifically, a height of the second frame glue 32 is in a range from 3 μm to 20 μm, and the width of the second frame glue 32 is in a range from 0.1 mm to 5 mm.

Specifically, the distance between the internal edge of the second frame glue 32 and the edge of the OLED component 20 is in a range from 1 mm to 10 mm along the horizontal direction.

Specifically, the third inorganic layer 43 may be made by at least one of silicon oxide, silicon nitride, and aluminum oxide.

Specifically, the thickness of the third inorganic layer 43 is in a range from 100 nm to 1 μm.

Preferably, the materials, the dimension, and a projection location of the third inorganic layer 43 on the base substrate 10 are the same of that of the first inorganic layer 41 and the second inorganic layer 42.

Specifically, the second organic layer 52 is made by organic resin. Preferably, the second organic layer 52 includes at least one of silicone resin and polymethylmethacrylate.

Specifically, the thickness of the second organic layer 52 is in a range from 500 nm to 5 μm.

In view of the above, by adopting the frame glue to block the organic layer and to limit the dimension of the organic layer, each of the organic layers can be completely covered by the inorganic layer arranged thereon. This not only enhances the encapsulation effect, and the inorganic layers can be manufactured by the same mask, which reduces the number of the masks so as to reduce the manufacturing cost.

The OLED encapsulation method combines the frame glue encapsulation technology and the thin film encapsulation technology. By adopting the frame glue to block the organic layer and to limit the dimension of the organic layer, each of the organic layers can be completely covered by the inorganic layer arranged thereon. At the same time, the inorganic layers may be manufactured by the same mask, which reduces the number of the mask so as to reduce the cost. The OLED encapsulation structure combines the frame glue encapsulation technology and the thin film encapsulation technology. By adopting the frame glue to block the organic layer and to limit the dimension of the organic layer, each of the organic layers can be completely covered by the inorganic layer arranged thereon. At the same time, the inorganic layers may be manufactured by the same mask, which reduces the number of the mask so as to reduce the cost.

It is believed that the present embodiments and their advantages will be understood from the foregoing description, and it will. be apparent that various changes may be made thereto without departing from the spirit and scope of the invention or sacrificing all of its material advantages, the examples hereinbefore described merely being preferred or exemplary embodiments of the invention.

What is claimed is:

1. An organic light-emitting diode (OLED) encapsulation method, comprising:
    step 1: providing a base substrate, and forming an OLED component on the base substrate;
    step 2: forming first frame glue on the base substrate, the first frame glue is configured to be in a rim of the OLED component, and curing the first frame glue, a height of the first frame glue is greater than the height of the OLED component;
    step 3: forming a first inorganic layer on the OLED component, the first frame glue, and the base substrate, the first inorganic layer covers the OLED component and the first frame glue, and a dimension of the first inorganic layer is greater than the dimension surrounded by the first frame glue along a horizontal direction;
    step 4: forming a first organic layer within the first inorganic layer on the first inorganic layer, and curing the first organic layer;
    step 5: forming a second inorganic layer on the first organic layer and the first inorganic layer, and the second inorganic layer covers the first organic layer, and the dimension of the second inorganic layer is greater than the dimension of the first organic layer;
    wherein the method further comprises:
    step 6: forming at least one encapsulation unit on the second inorganic layer, the encapsulation unit comprises second frame glue, a second organic layer arranged within the second frame glue, and a third inorganic layer covers the second organic layer and the second frame glue.

2. The OLED encapsulation method as claimed in claim 1, wherein a height of the first frame glue is in a range from 3 µm to 20 µm, and a width of the first frame glue is in a range from 0.1 mm to 5 mm;
    a distance between an internal edge of the second frame glue and an edge of the OLED component is in a range from 1 mm to 10 mm;
    the first frame glue is made by at least one of silicone resin and polymethylmethacrylate.

3. The OLED encapsulation method as claimed in claim 1, wherein a distance between the edge of the first inorganic layer and the second inorganic layer and an external edge of the first frame glue is in a range from 50 µm to 2000 µm;
    a thickness of the first inorganic layer and the second inorganic layer is in a range from 100 nm to 1 µm;
    the first inorganic layer and the second inorganic layer are made by at least one of silicon oxide, silicon nitride, and aluminum oxide;
    the first inorganic layer and the second inorganic layer are made by at least one of Plasma Enhanced Chemical Vapor Deposition (PECVD), Atomic Layer Deposition (ALD) and Sputtering.

4. The OLED encapsulation method as claimed in claim 1, wherein the thickness of the first organic layer is in a range from 500 nm to 5 µm;
    the first organic layer is made by at least one of silicone resin and polymethylmethacrylate;
    the first organic layer is manufactured by at least one of screen printing, spin coating, ink jet printing, and cast film formation.

5. An OLED encapsulation structure, comprising:
    a base substrate, an OLED component arranged on the base substrate, first frame glue arranged on the base substrate and the first frame glue is in a rim of the OLED component, and a first inorganic layer arranged on the OLED component, the first frame glue, and the base substrate, a first organic layer arranged on the first inorganic layer and the first organic layer is surrounded by the first frame glue, and a second inorganic layer on the first organic layer and the first inorganic layer;
    a height of the first frame glue is greater than the height of the OLED component, the first inorganic layer covers the OLED component and the first inorganic layer, and the dimension of the first inorganic layer is greater than the dimension surrounded by the first frame glue along a horizontal direction; the second inorganic layer covers the first organic layer, and the dimension of the second inorganic layer is greater than the dimension of the first organic layer;
    wherein the encapsulation structure further comprises at least one encapsulation unit on the second inorganic layer, the encapsulation unit comprises second frame glue, a second organic layer arranged within the second frame glue, and a third inorganic layer covers the second organic layer and the second frame glue.

6. The OLED encapsulation structure as claimed in claim 5, wherein a height of the first frame glue is in a range from 3 µm to 20 µm, and a width of the first frame glue is in a range from 0.1 mm to 5 mm;
    a distance between an internal edge of the second frame glue and an edge of the OLED component is in a range from 1 mm to 10 mm;
    the first frame glue is made by at least one of silicone resin and polymethylmethacrylate.

7. The OLED encapsulation structure as claimed in claim 5, wherein a distance between the edge of the first inorganic layer and the second inorganic layer and an external edge of the first frame glue is in a range from 50 µm to 2000 µm;
    a thickness of the first inorganic layer and the second inorganic layer is in a range from 100 nm to 1 µm;
    the first inorganic layer and the second inorganic layer are made by at least one of silicon oxide, silicon nitride, and aluminum oxide.

8. The OLED encapsulation structure as claimed in claim 5, wherein the thickness of the first organic layer is in a range from 500 nm to 5 µm;
    the first organic layer is made by at least one of silicone resin and polymethylmethacrylate.

9. An OLED encapsulation structure, comprising:
    a base substrate, an OLED component arranged on the base substrate, first frame glue arranged on the base substrate and the first frame glue is in a rim of the OLED component, and a first inorganic layer arranged on the OLED component, the first frame glue, and the base substrate, a first organic layer arranged on the first inorganic layer and the first organic layer is surrounded by the first frame glue, and a second inorganic layer on the first organic layer and the first inorganic layer;

a height of the first frame glue is greater than the height of the OLED component, the first inorganic layer covers the OLED component and the first inorganic layer, and the dimension of the first inorganic layer is greater than the dimension surrounded by the first frame glue along a horizontal direction; the second inorganic layer covers the first organic layer, and the dimension of the second inorganic layer is greater than the dimension of the first organic layer;

wherein a height of the first frame glue is in a range from 3 μm to 20 μum, and a width of the first frame glue is in a range from 0.1 mm to 5 mm;

a distance between an internal edge of the second frame glue and an edge of the OLED component is in a range from 1 mm to 10 mm;

the first frame glue is made by at least one of silicone resin and polymethylmethacrylate;

wherein a distance between the edge of the first inorganic layer and the second inorganic layer and an external edge of the first frame glue is in a range from 50 μm to 2000 μm;

a thickness of the first inorganic layer and the second inorganic layer is in a range from 100 nm to 1 μm;

the first inorganic layer and the second inorganic layer are made by at least one of silicon oxide, silicon nitride, and aluminum oxide;

wherein the encapsulation structure further comprises at least one encapsulation unit on the second inorganic layer, the encapsulation unit comprises second frame glue, a second organic layer arranged within the second frame glue, and a third inorganic layer covers the second organic layer and the second frame glue.

10. The OLED encapsulation structure as claimed in claim 9, wherein the thickness of the first organic layer is in a range from 500 nm to 5 μm;

the first organic layer is made by at least one of silicone resin and polymethylmethacrylate.

* * * * *